United States Patent Office 3,175,934

Patented Mar. 30, 1965

3,175,934

SEMICONDUCTOR SWITCHING ELEMENT AND PROCESS FOR PRODUCING THE SAME

Masami Tomono, Takeshi Takagi, Takashi Tokuyama, and Kogo Sato, all of Tokyo-to, Japan, assignors to Kabushiki Kaisha Hitachi Seisakusho, Tokyo-to, Japan, a joint-stock company of Japan Filed Dec. 28, 1960, Ser. No. 78,990

Claims priority, application Japan, Jan. 19, 1960, 35/1,207; Feb. 1, 1960, 35/2,883

4 Claims. (Cl. 148—177)

This invention relates to semiconductor elements, and more particularly it relates to a new and improved semiconductor switching element of two-electrode or three-electrode type wherein germanium, silicon, or some other semiconductor is used as the base body and to a process for producing the same.

More specifically, the semiconductor switching element of the invention is a two-electrode, semiconductor switching element or a three-electrode, semiconductor switching element obtained by providing the second or third semiconductor domain of the said two-electrode switching element with an additional, third electrode which are characterized by the following features. A first semiconductor domain of the first conductivity type, a second semiconductor domain of a second conductivity type, or of the first conductivity type, and having a lower impurity concentration than the aforesaid first semiconductor domain (hereinafter this second semiconductor domain will be referred to by the abbreviated term "s domain"); a third semiconductor domain of the first conductivity type; and a fourth semiconductor domain of the second conductivity type are connected successively to form a pspn or an nsnp switching element. At the same time, the effective concentration of the active impurities of the fourth semiconductor domain is made to be lower than the active impurity concentration of the third semiconductor domain, whereby the current amplification factor of the minority carrier which is injected from the fourth semiconductor domain to the third semiconductor domain is made sufficiently small in the small-current region, and, as the current increases, the said amplification factor is caused to increase. Furthermore, the sum of the said amplification factor and the effective current amplification factor which is injected from the first semiconductor domain to the second semiconductor domain is caused to be less than one (unity) in the small-current region and be one (unity) or higher as the current increases.

It is an object of the present invention to eliminate the disadvantages appearing in the production process for and characteristics of conventional switching elements as will be described hereafter.

The manner in which the foregoing object and other objects may best be achieved as well as the details of the invention will be understood more fully from a consideration of the following description, taken in conjunction with the accompanying illustrations, in which the same or equivalent parts are designated by the same reference numerals and letters, and in which.

For a better understanding of the details of the present invention, it will be most advantageous to consider, prior to referring to a detailed disclosure of the same, the outline presented below of a pnpn switching element of the general type used heretofore.

Figure 1:
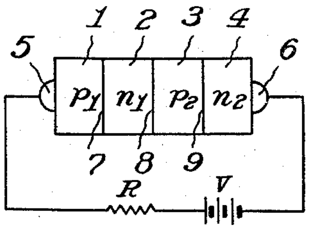
Fig. 1 (PRIOR ART)
FIG. 1 is an electric circuit diagram illustrating the operational principle of a two-electrode switching element.

As an example of a two-electrode switching element used hitherto, in general, the element indicated in FIG. 1 may be considered. Here, a first semiconductor domain 1 of a first conductivity type, a second semiconductor domain 2 of a second conductivity type, a third semiconductor domain 3 of the first conductivity type, and a fourth semiconductor domain 4 of the second conductivity type are successively connected to compose the switching element, and the semiconductor domains 1 and 4 at the ends of the switching element are provided, respectively, with electrodes 5 and 6.

In the order to simplify the following description, the first and second conductivity types will be taken to be, respectively, p and n-types as in the drawing, and the semiconductor domain 1, 2, 3, and 4 will be respectively represented by $p_1$, $n_1$, $p_2$ and $n_2$. If, as shown in the drawing, a voltge V is impressed so that electrode 5 becomes positive and electrode 6 becomes negative, the $p_1n_1$ junction 7 and $p_2n_2$ junction 9 will be biased in the forward direction, but the $n_1p_2$ junction 8 will be biased in the reverse direction. Now, if the voltage V is increased progressively from zero, only an extremely small current will flow as indicated by the curve 11 in FIG. 2, and a switch-off characteristic will be exhibited. However, when the impressed voltage V reaches a limiting value $V_0$, the current increases abruptly, then moves through a negative resistance phase 12 into a region of high current, that is, one of switch-on characteristic. At this time, a greater part of the voltage V is imposed on the load resistance R, and a very low voltage $V_s$ is imposed between the electrodes 5 and 6.

The details of the characteristics in this kind of switching action, as clarified by J. L. Moll and others in the "Proceedings of the I.R.E.," vol. 44 (1956), 1174 through p. 1182, will be apparent from the following description. In the construction of $p_1n_1p_2$ and $n_2p_2n_1$ of the $p_1n_1p_2n_2$ switching element, in the case wherein the $p_1$ domain 1 and the n domain 4 are made the emitters in, respectively, $p_1n_1p_2$ and $n_2p_2n_1$ transistors, if the effective current amplification factor of the former is designated by $\alpha_p$ and that of the latter is designated by $\alpha_n$, and if in the element which is so made that the said $\alpha_p$ and said $\alpha_n$ are relatively small, the current caused to flow by the voltage impressed on the two ends of the said element is caused to be relatively low, it will be possible to establish the following equation.

$$\alpha_p+\alpha_n=\alpha_T<1 \quad (1)$$

Figure 2:
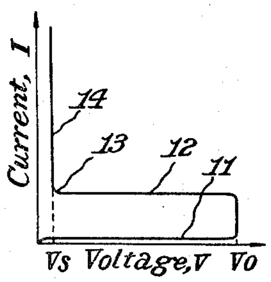
FIG. 2 is a graphical representation of the fundamental characteristic of the circuit of FIG. 1.

In this case, the greater part of the impressed voltage V is imposed on the $n_1p_2$ junction 8, which is biased in the reverse direction, and the switch-off characteristic 11 in FIG. 2 is exhibited. Then, if in the said element at least one of the effective current amplification factors $\alpha_p$ and $\alpha_n$ is adapted, by some method, to be dependent on the current which flows through the element and to increase, the current which flows through the said element will also increase in conformance with the increase of the impressed voltage V, and, in accordance with this, $\alpha_T$ of Equation 1 will approach one (unity). Then, if this condition progresses further, and an avalanche phenomenon develops in the $n_1p_2$ junction 8, and the current multiplication factor at this time is divided into a positive hole and electron and designated respectively by $M_p$ and $M_n$, the following equations will be valid.

$$M_p\alpha_p+M_n\alpha_n=1 \quad (2)$$

The voltage in this condition is the breakover voltage $V_0$ indicated in FIG. 2. However, the current multiplication factors $M_p$ and $M_n$ in this case are subject to substantial variations depending on the characteristic of the $n_1p_2$ junction 8, and cases wherein either one or both of the said factors $M_p$ and $M_n$ are equal to one (unity) are also possible. If, in this condition, the current continues to increase, $\alpha_T$ will further increase until, finally, the following condition will be satisfied.

$$\alpha_T=\alpha_p+\alpha_n=1 \quad (3)$$

Then, the relation $M_p=M_n=1$ will become valid, the voltage imposed on the $n_1p_2$ junctions 8 will become extremely low, the condition represented by the region of negative resistance in FIG. 2 will be passed, and that represented by the point 13 will be reached. The voltage at this time is the sustaining voltage $V_s$. From the said point 13, the condition enters a region of high current as represented by the curve 14, which is a switch-on condition.

Figure 3:
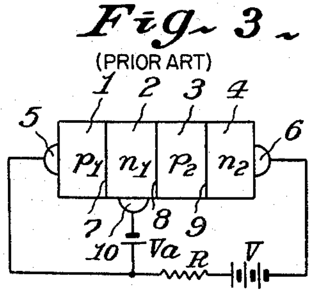
Fig. 3 (PRIOR ART)
FIG. 3 is an electric circuit diagram illustrating the operational principle of a three-electrode switching element.
Figure 4:
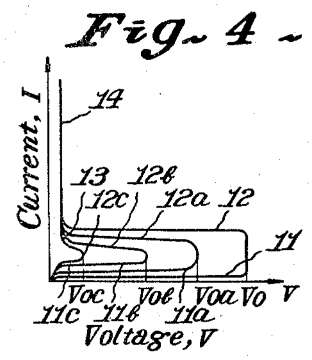
FIG. 4 is a graphical representation of the fundamental characteristic of the circuit of FIG. 3.

Next, a three-electrode switching element provided with a third electrode 10 which is made to contact to the $n_1$ domain of a $p_1n_1p_2n_2$, two-electrode switching element will be described with reference to FIGS. 3 and 4. First, a bias voltage $V_a$ is impressed between the electrodes 5 and 10 so as to make the $p_1$ domain positive and the $n_1$ domain negative, in other words, so that the $p_1n_1$ junction is biased in the regular direction, and current $I_b$ is thereby caused to flow. Then, if, under this condition, the voltage V impressed between the electrodes 5 and 6 of the two ends is varied, the current in the off condition will be caused to increase by the amplification action of the $p_1n_1p_2$ construction, and, at the same time, the breakover voltage $V_0$ will be reduced.

This action may be explained with reference to FIG. 4. First, if the bias voltage $V_a$ is increased progressively from zero, the current of the switch-off condition will increase from 11 as indicated by the curves $11_a$, $11_b$, and $11_c$. In accordance with this, the breakover voltage will progressively decrease from $V_0$ as indicated by $V_{0a}$, $V_{0b}$, and $V_{0c}$. This is because the current in the off condition is caused to increase by the bias voltage $V_a$, the current flowing with respect to the same value of voltage V becomes higher, and the factors $\alpha_p$, $\alpha_n$, $M_p$, $M_n$, and others which are dependent on this current conform to the above-mentioned Equation 2 at a relatively low voltage.

By the use of the three-electrode switching element described above, it is possible to select, at will within a certain range, the breakover voltage during switching. Moreover, if the voltage V between the electrodes 5 and 6 is maintained constant, and a signal voltage is caused to be introduced between the electrodes 5 and 10, it will be possible to open and close high electric power by the use of a relatively small signal. Furthermore, although in the above description the third electrode 10 was provided in the $n_1$ domain, if this electrode is provided in the $p_2$ domain, and suitable connections are made, the element can be made to operate in almost the same manner as described above.

In the above-described two-electrode or three-electrode switching element, it is an extremely important requisite that at least one of the current amplification factors $\alpha_p$ and $\alpha_n$ is adopted to be dependent on the current which flows through the said element. That is, it is necessary to make at least one of the said current amplification factors $\alpha_p$ and $\alpha_n$ relatively small in the low-current region, yet its value must increase in accordance with the increase of the said current. Heretofore, the above requisite has been satisfied by the following conventional measures and construction.

Figure 5:
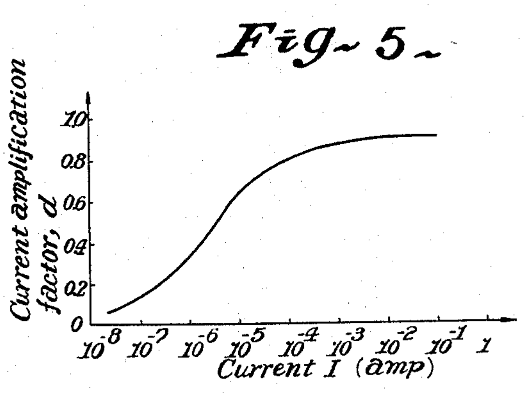
FIG. 5 is a graphical representation of the current dependency of the effective current amplification factor of a transistor wherein silicon is used as the base body.

It is well known in the art that, in a semiconductor having silicon as the base body, the current amplification factor $\alpha$ has a substantial current dependency. An example of this is shown in FIG. 5, wherein the variation of the current amplification factor with respect to the emitter current of a silicon transistor is indicated. Such a characteristic may be described as follows. First, in the case wherein the injection of the minority carrier from the emitter is small, the said minority carrier and the majority carrier are recoupled within the base domain through the recombination center within the base domain, and the greater part of the said minority carrier is dissipated, only an extremely small quantity reaching the collector junction. For this reason the current amplification factor becomes quite small. However, as the current flowing through the said element gradually increases, and the quantity of the minority carrier being injected increases, the recombination in the base domain reaches a saturated state, and the proportion of the minority carrier which is dissipated is reduced. Conceivably this is the reason for the increase in the current amplification factor. Thus, if a pnpn switching element is produced by utilizing the above characteristic, it is possible to vary both of the current amplification factors $\alpha_p$ and $\alpha_n$.

Figures 6, 7:
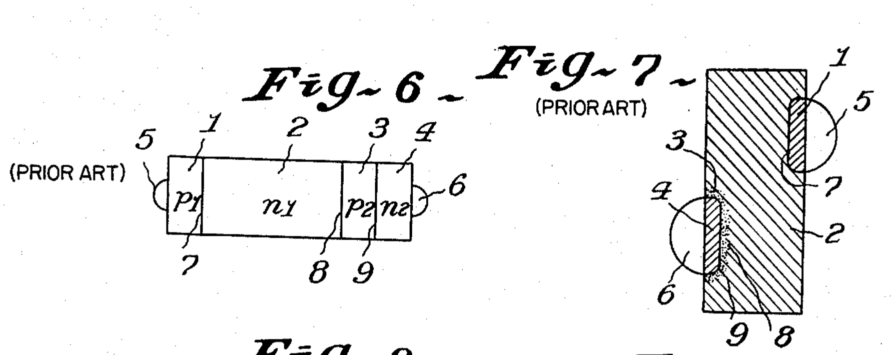
FIGS. 6 and 7 are, respectively, a schematic diagram and a constructional diagram, in section, showing a two-electrode switching element of conventional type.

Next a pnpn switching element in which germanium is used as the base body will be considered. In the case of semiconductor elements in which germanium is used, particularly in the case of such elements as transistors and pnpn switching elements, it is difficult to cause the above-described phenomenon. Therefore, it has been the practice to provide the current amplification factor $\alpha_p$ or $\alpha_n$ with current dependency by suitably devising the geometric construction and dimensions as indicated in FIGS. 6 and 7. One method as illustrated in FIG. 6 is to make the width of the $n_1$ domain greater than the diffusion length of the minority carrier. Then, when the current flowing through the element is low, the minority carrier which is injected from the $p_1$ domain 1 to the $n_1$ domain 2 moves, principally, toward the $n_1p_2$ junction by diffusion, but since the width of the $n_1$ domain 2 is sufficiently large, the greater portion thereof is recombined within the $n_1$ domain 2 and is dissipated, and the quantity thereof reaching the $n_1p_2$ junction 8 is extremely small. Accordingly, when the impressed voltage V is low, the current amplification factor $\alpha_p$ is remarkably small, but as the impressed voltage increases gradually and the current flowing through the element also increases, the minority carrier injected from the $p_1$ domain to the $n_1$ domain 2 is accelerated because of the electric potential gradient created within the $n_1$ domain 2. Accordingly, the proportion of the said carrier reaching the $n_1p_2$ junction 8 also becomes large, and the current amplification factor increases. In this manner, it is possible to provide the current amplification factor $\alpha_p$ with current dependency. Regarding a type of construction based on this principle, a description by I. A. Lesk is given in the I.R.E. "Transaction on Electron Devices" (1959), pages 28 through 35.

FIG. 7 illustrates another measure which has been proposed. During the fabrication of a pnpn switching element by welding active impurities to a germanium base body 2, which indicates p type conductivity, by the alloy diffusion method and an ordinary alloy method, the center axes of the impurity dots 5 and 6 are left in suitably displaced positions relative to each other. In this manner, it is possible to provide the current amplification factor with current dependency, similarly as in the case of the afore-described element. The parts whose description has been omitted with regard to FIG. 7 correspond to those in FIG. 6 as indicated by the same reference symbols.

When the current amplification factor $\alpha$ is provided with current dependency by a conventional construction based on an expedient as described above, it is necessary, in all cases, to dissipate by recombining at an intermediate point the greater part of the minority carrier which is injected from at least one of the two electrodes in the low-current region. For this reason, the method is subject to the effect of surface recombination; consequently, there exists the possibility of great variations, due to the surroundings and other conditions, in the absolute value of the current amplification factor $\alpha$ and its current dependency, and it is extremely difficult to maintain the break-over voltage $V_0$ constant. Furthermore, the current amplification factor $\alpha$ is greatly influenced by the number of body recombination centers in the base body semiconductor itself, and it is extremely difficult to control the concentration of body recombination centers to a desired value in such semiconductor materials as germanium and silicon. Accordingly, it is difficult, from this aspect also, to produce a seed element having uniform characteristics. Moreover, when the geometric dimensions are varied to provide the current amplification factor $\alpha$ with current dependency as in the case of this seed element in which germanium is used, an extremely precise control over dimensions is required, and this requirement makes it further difficult to obtain a product which has uniform characteristics. A further disadvantage exists in that, since the geometric width of the $n_1$ or $p_2$ domain in this case becomes large, the switching speed drops.

The present invention eliminates the disadvantages in production process and characteristics relating to conventional switching elements as described above and provides the current amplification factor with current dependency by a principle which is totally different from that employed in the conventional switching elements described above. The details of the present invention will be apparent from the following description.

Figure 8:
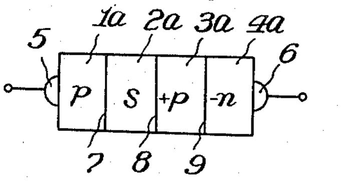
FIGS. 8 and 9 are, respectively, schematic diagrams of a two-electrode and a three-electrode switching element according to the present invention.

Referring to FIG. 8, the embodiment of the invention shown therein is a two-electrode switching element comprising a first semiconductor domain 1*a* of a first conductivity type; a second semiconductor domain ("s domain") 2*a* which has an impurity concentration substantially lower than that of the first semiconductor domain 1*a*, and which is of the first conductivity type, an instrinsic conductivity type (i type), or a second conductivity type; a third semiconductor domain 3*a* of high impurity concentration and of the first conductivity type ($p^+$ or $n^+$); and a fourth semiconductor domain 4*a* of lower impurity concentration than the third semiconductor domain 3*a* and of the second conductivity type ($n^-$ or $p^-$). The other parts of the element have the same reference designations as in FIG. 1.

The case wherein the semiconductor domains 1*a*, 2*a*, 3*a*, and 4*a* are made to be, respectively, p, s, $p^+$, and $n^-$, will first be considered. Referring to the FIG. 8, the effective current amplification factor for the case in which the minority carrier is injected from the p domain 1*a* to the $p^+$ domain 3*a* will be designated by $\alpha_p$. Then, by making the s domain 2*a* have a high specific resistance and making it shorter than the diffusion length of the minority carrier (positive hole), it is possible to make $\alpha_p$ sufficiently large, similarly as in the case of an ordinary junction type transistor. In this case, it is possible to reduce this value to a certain extent by placing the s domain in an i or $p^-$ condition. In this case, the value of $\alpha_p$ is preferably such that $\alpha_p \geqq 0.9$.

Then, if the effective current amplification factor for the case wherein a minority carrier is injected from the $n^-$ domain 4*a* to the s domain 2*a* is designated by $\alpha_n$, the rate of injection $\gamma$ of the electrons from the $n^-$ domain of low concentration of active impurity to the $p^+$ domain of high concentration of active impurity will become less than one (unity) and can be represented by the following equation.

$$\gamma = \frac{D_n}{D_p} \cdot \frac{W_n}{W_p} \cdot \frac{n_0}{P_0} \left(1 + \frac{P}{n_0}\right) \quad (5)$$

where $D_n$ and $D_p$ are, respectively, the diffusion coefficients of the minority carrier in the $p^+$ and $n^-$ domains; $W_n$ and $W_p$ are, respectively, the widths of the $n^-$ and $p^+$ domains; $n_o$ and $p_o$ are, respectively, the effective impurity concentrations within the $n^-$ and $p^+$ domains; and $p$ is the excess, positive-hole concentration injected into the $n^-$ domain. In the above Equation 5, calculation is to be performed under the assumption that $p_0 >> n_0$, and the said equation is applicable to the case wherein the thicknesses of the $p^+$ and $n^-$ domains are made shorter than the diffusion lengths of the electrons and positive holes in the respective domains thereof. If the domains are thicker than their respective diffusion lengths, the Equation 5 may be amended accordingly. In this Equation 5, the value of $D_n/D_p$ may be thought to be approximately 2 with respect to germanium. The value of $W_n/W_p$ will vary depending on the production process, but may be taken as being between 0.1 and 10. Since $n_0/p_0 << 1$, $\gamma$ is small relative to one (unity) and increases in accordance with increase of the value of $p$, that is, the increase of the current flowing through the element.

Accordingly, since the effective current amplification factor $\alpha_n$ at this time increases together with the increase in the current flowing through the said element, by selecting the impurity concentration and thickness of the s domain so that the said current amplification factor $\alpha_p$ will be, for example, of the order of 0.9; at the same time, increasing the impurity concentration of the $p^+$ domain so that the current amplification factor $\alpha_n$ will become of the order of approximately 0.1 in the region of infinitesimally low current; and, at the same time, lowering the impurity concentration of the $n^-$ domain, thereby making the sum $\alpha_T$ of the aforesaid $\alpha_p$ and $\alpha_n$ become slightly smaller than one (unity) and, at the same time, causing the current flowing through the said element to increase; the aforesaid $\alpha_n$ is increased slightly, and the sum $\alpha_T$ of $\alpha_p$ and $\alpha_n$ at the time is caused to be one (unity) or higher.

Figure 9:
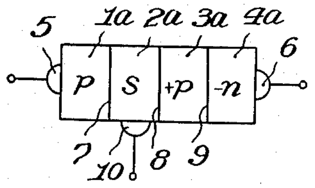

By the practice of this invention as described above, it is not necessary to make the geometric dimension of the second semiconductor domain longer than the diffusion length of the minority carrier which is injected therein as in the case of conventional switching elements, whereby it is possible to eliminate the disadvantages of the conventional switching elements. If $\alpha_p$ is made to be smaller than 0.9, it will be necessary to increase $\alpha_n$ accordingly. It will be obvious that by providing a third electrode 10 at the s domain 2*a* or the $p^+$ domain 3*a* as indicated in FIG. 9, the element can be made into a 3-electrode switching element.

It is a further object of the invention to provide a method suitable for obtaining the above-described $psp^+n^-$ or $nsn^+p^-$ switching elements wherein the various disadvantages accompanying conventionally known, $p_np_n$ switching elements have been eliminated.

Figure 10:
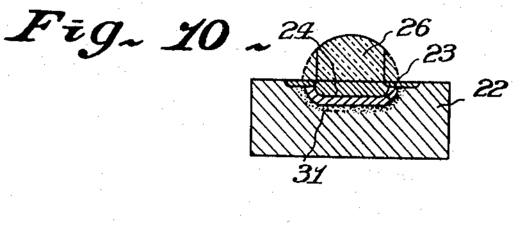
FIG. 10 is a simplified diagram, in section, showing an spn junction obtained by the process of the present invention.

The said method utilizes the variation of the apparent segregation coefficient $k_{eff.}$ during the growth of a recrystallized semiconductor from a semiconductor molten liquid (melt) containing a donor and an acceptor impurity. Referring to FIG. 10, a low melting-point, impurity alloy 26, containing both a donor impurity (for example, antimony) and an acceptor impurity (for example, indium) and, in some cases, another metal (for example, lead or tin) which has little effect relative to the semiconductor, is placed on a semiconductor (thin germanium wafer) 22, which constitutes a base body of n type, and is heated to a temperature which is lower than the melting point of the said base body semiconductor 22 but is higher than the melting point of the said impurity alloy 26 to melt a portion of the said base body semiconductor 22 into the molten impurity 26. Then the materials are cooled to form a p-type semiconductor domain 23 and an n-type semiconductor domain 24 within the intermediate layer between the semiconductor 22 and the impurity alloy 26, that is, within the region being recrystallized. Further details of the method of the present invention will be more clearly apparent by reference, prior to consideration thereof, to the following outline description of obtaining a semiconductor from a molten liquid (melt) of a semiconductor and impurity, that is recrystallization.

As is clearly revealed in the thesis by D. Turnbull and others in the "Journal of Applied Physics," vol. 21 1950, p. 804, in the recrystallization of semiconductors, in general, supercooling occurs readily, and when a certain degree of supercooling is reached, the growth of the recrystallized crystal takes place at a rapid rate. It is conceivable that the recrystallization growth at this time is accomplished at a rate which is substantially more rapid than the average cooling rate. According to experiments by the present inventors, in the case wherein, for example, an impurity alloy with indium as the principal constituent is welded by melting to a base body of germanium, the rate of recrystallization growth of the germanium from the resulting melt was of the order of 1 to 2 millimetres per minute, which is a value 100 to 1,000 times the average cooling rate.

Figure 11:
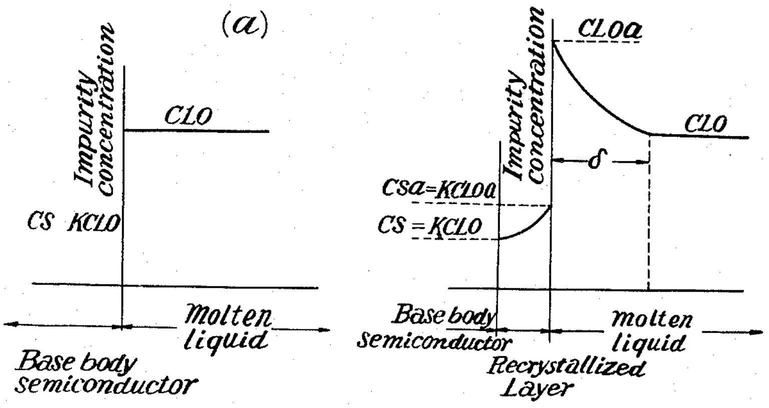
FIG. 11 is a graphical representation indicating the distribution of impurity concentration with the recrystallized layer and molten liquid during a recrystallization process.

If the base body semiconductor in the solid state and the molten impurity alloy phase which is in a balanced condition therewith are now considered, and if the quantity of the donor (or acceptor) impurity within the said molten alloy is small relative to those of the other constituents therein, for example, lead, tin, etc., the distribution of the said donor (or acceptor) impurity within the surface portion of the semiconductor and within the molten alloy at the time recrystallization begins will be as indicated in FIG. 11(*a*). In this illustration, $C_s$ denotes the impurity concentration within the recrystallized layer, $C_{L0}$ denotes the impurity concentration within the molten liquid in contact with said recrystallized layer. The relation between the impurity concentration within the recrystallized layer, $C_s$, and the impurity concentration within the molten liquid in contact with the recrystallized layer, $C_{L0}$, is expressed by $C_s/C_{L0}=k$, where $k$ is a constant called the segregation coefficient.

Next, the stage wherein the temperature decreases, and the growth of the recrystallized layer progresses will be considered. Particularly in the case wherein $k<<1$, and as the semiconductor is obtained on the surface of the base body semiconductor from the molten alloy phase, and the recrystallization progresses, almost all of the aforesaid impurity is left remaining within the portion of the molten alloy phase in contact with the recrystallized layer. Accordingly, as the recrystallization progresses, the impurity concentration within the molten alloy layer, especially in the vicinity of the interface between the said layer and the said recrystallized crystal, becomes high, and the impurity of this portion moves by diffusion from the interface into the molten alloy. Therefore, the condition of the impurity concentration while the recrystallization is progressing becomes as indicated in FIG. 11(*b*). In other words, the impurity concentration of the interface is increased and becomes $C_{L0a}$, and the impurity concentration $C_{sa}$ within the recrystallized layer becomes $kC_{L0a}$. If the diffusion coefficient of the impurity within the molten liquid is denoted by D, and the time required for recrystallization is denoted by $t$, the distance $\delta$ wherein the variation of impurity concentration is principally taking place within the molten liquid may be represented as an approximation by the following equation.

$$\delta \approx \sqrt{Dt} \qquad (6)$$

Accordingly, the apparent segregation coefficient in this case (FIG. 11(*b*)), that is, the effective segregation coefficient becomes as follows:

$$k_{eff.}=kC_{L0a}/C_{L0} \qquad (7)$$

where $C_{L0a}/C_{L0}>1$.

Figure 12:
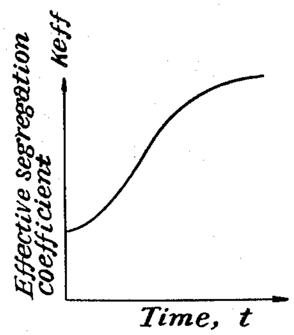
FIG. 12 is a graphical representation illustrating the variation of effective segregation coefficient which occurs with the time for the case in which recrystallization is progressing at a constant speed.

As is apparent from the above consideration, the effective segregation coefficient $k_{eff.}$ for the case wherein recrystallization is being effected at a constant speed varies with the lapse of time, and the degree of this variation varies significantly as the rate of recrystallization increases. One example of this is indicated in FIG. 12.

Moreover, in the case wherein, during the growth, for example, of a germanium monocrystal, the speed of crystal growth is relatively high, the degrees of the variations of the effective segregation coefficients of the donor (for example, antimony) impurity and the acceptor (for example, gallium) impurity are such that the variation of the former (donor impurity) is substantially greater than that of the latter (acceptor impurity). This fact is generally known through such disclosures as, for example, the thesis by J. A. Burton and others in the "Journal of Chemical Physics," vol. 21 (1953), p. 1987. The reasons for this phenomenon may be considered to be as follows:

Since the diffusion coefficient within the molten liquid of such a donor impurity as antimony is smaller than that of such an acceptor impurity as gallium, the said donor impurity readily collects with the molten liquid of the impurity alloy in the vicinity of the recrystallized surface, and the degree of variation of the effective segregation coefficient $k_{eff.}$ at the aforesaid rate of recrystallization growth becomes great. For example, in the case of a rate of growth of a monocrystal of 0.4 mm./min., the effective segregation coefficients $k_{eff.}$ of antimony and gallium are, respectively, 0.003 and 0.11, but in the case wherein the rate speed of growth is 2 mm./min., the effective segregation coefficients $k_{eff.}$ of the said antimony and gallium are, respectively, 0.006 and 0.12. That is, in these cases, the coefficient $k_{eff}$ of the antimony is doubled, while, in contrast, that of the gallium is increased by only 10 percent.

Figure 13:
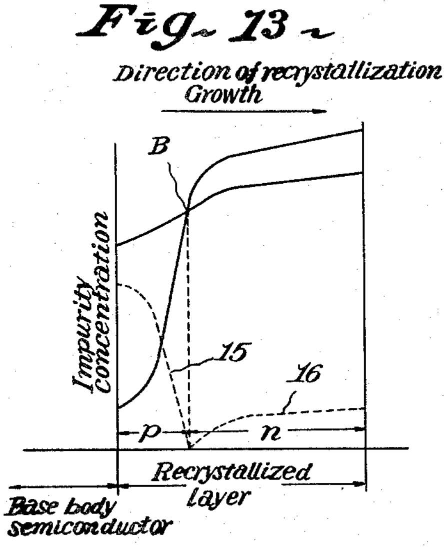
FIG. 13 is a graphical representation indicating the distribution of impurity concentration within the recrystallized layer of a semiconductor switching element obtained by the process of this invention.

The present invention utilizes the above-described phenomenon in the following manner. An impurity alloy wafer formed by being made to contain simultaneously a donor impurity (for example, antimony) and an acceptor impurity (for example, indium) is caused to adhere onto a thin wafer of monocrystalline germanium of n-type. The said impurity alloy is then heated to a suitable temperature, similarly as in the general alloy junction method, to melt the said impurity alloy, and the portion of the germanium in contact therewith is caused to fuse into the said molten liquid. Then, after a certain time, as the parts are cooled at a relatively slow rate, the molten liquid undergoes supercooling, and when this supercooling reaches a limiting value, a recrystallized layer of germanium is formed with a rate of growth which is substantially greater than the rate of cooling. If the compositional proportions of the two impurities in the impurity alloy has been selected suitably, the substantial difference in the proportions of variation of the effective segregation coefficients in the said two impurities causes a large quantity of indium to be obtained in the recrystallized layer during its initial stage of recrystallization as indicated in FIG. 13, and the said layer becomes a region of p-type. However, as the recrystallization progresses, the effective segregation coefficient $k_{eff.}$ of the antimony increases markedly, and the quantity of antimony obtained in the recrystallized layer gradually increases until the point B in FIG. 13 is exceeded, whereupon more antimony than indium is obtained, and the region reverts to one of n-type. Thus, by alloying one piece of impurity alloy on germanium of n-type in this manner, an npn junction is formed.

In FIG. 13, the curve 15 and the curve 16 represent, respectively, the concentration differences between the donor impurity and the acceptor impurity, that is, the effective impurity concentrations, in the p domain and the n domain obtained in the above-described manner. It is possible, furthermore, to adjust at will the thickness of the p-type recrystallized layer 23 by varying the proportions of the donor and acceptor impurities in the above-described process. Accordingly, it is possible to form an extremely thin p-type recrystallized layer. Moreover, by varying such factors as the ratio of indium to antimony within the molten alloy, the rate of recrystallization growth, and the thicknesses of the various domains, it is possible to cause various changes in the ratio between the effective impurity concentration within the p domain and the effective impurity concentration within the n domain. Therefore, as indicated in FIG. 13, it is a simple matter to make the effective impurity concentration within the p domain amply greater than the effective impurity concentration within the n domain.

Figure 14:
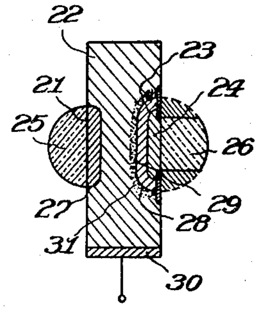
FIG. 14 is a simplified diagram, in section, showing a pspn switching element obtained by the process of this invention.

As indicated in FIG. 14, the present inventors provided a p-type electrode 21 additionally to a base body semiconductor layer 22 of an element having a $p^+n^-$ junction obtained in accordance with the above-described principle to fabricate a $psp^+n^-$ switching element, whereby it was possible to obtain, with high yield and little scattering, a $psp^+n^-$ switching element of excellent characteristics.

The details of the method of fabricating a $psp^+n^-$ switching element according to the process of this invention will be apparent by reference to the following description. First, on one surface of a thin piece 22 of a semiconductor, for example, germanium, an impurity alloy piece 25 composed by causing lead to contain a small quantity of indium is caused to adhere, and on the opposite surface thereof an impurity alloy piece 26 composed by causing lead to contain from 5 through 30 percent of indium and a smaller quantity, for example, from 0.1 through 20 percent, of antimony is made to adhere. These impurity alloys are caused to be welded to the said thin piece 22 at a temperature between 700° C. and 750° C., then cooled at rate of from 25° C./min. through 50° C./min.

The recrystallized layer 21 created during this process is, of course, of p-type, but the recrystallized layers formed on the side opposite thereto are a p-type recrystallized layer 23 and an n-type recrystallized layer 24 due to the difference in proportions of variation of the aforesaid effective segregation coefficients. In the recrystallized layers 23 and 24 obtained under the various conditions stated above, the effective impurity concentration within the p domain 23 becomes higher than the effective impurity concentration within the n domain 24.

As a modification, moreover, a semiconductor of p-type conductivity of an impurity concentration lower than the impurity concentration of the i-type conductivity or p domain 21 may be used as the base body semiconductor. Furthermore, by varying the ratio between the antimony and the indium, it is possible to vary the ratio between the effective impurity concentrations of the $p^+$ domain 23 and the $n^-$ domain 24 ,whereby it is possible to vary the absolute value and current dependency of the aforesaid *n*. That is, if the quantity of the antimony, in this case, becomes large relative to that of the indium, the aforesaid *n* becomes gradually large, the possibility of the relation of Equation 2 or Equation 3 being satisfied becomes greater, and the breakover voltage $V_0$ gradually decreases. If the quantity of the antimony exceeds a certain limit, the negative resistance characteristic ceases to be exhibited.

If, when the impurity alloy pieces 25 and 26 are being welded to the thin germanium piece 22 in the process of the present invention, the welding concentration becomes high, or the retention time at this concentration becomes long, an n-type diffusion layer 31 will be formed within the thin germanium piece 22 since the diffusion coefficient within solid germanium of antimony is greater than that of indium. However, in the case wherein the thin germanium piece 22 is of n-type, i-type, or weak p-type, the characteristics of the $psp^+n^-$ switching element are not basically changed.

A further understanding of the invention will be gained from a consideration of the following examples of embodiments of the invention.

*Example 1*

For the impurity alloy 26 indicated in FIG. 14, an alloy containing 90 percent of lead, 9 percent of indium, and 1 percent of antimony (all percentages by weight) was used. For the impurity alloy 25, an alloy containing 90 percent of lead, and 10 percent of indium (both percentages by weight) was used. The above two alloys were caused to interfuse together with portions of an n-type base body of germanium 22 of 10 ohm cm. specific resistance at a temperature of 750° C. and were then cooled at a rate of 5° C./min. The two-electrode switching element thus obtained had a breakover voltage $V_0$ of approximately 6 volts, a sustaining voltage $V_s$ of approximately 0.5 volt, and a sustaining current $I_s$ of approximately 1 milliampere.

*Example 2*

For the impurity alloy 26 indicated in FIG. 14, an alloy containing 90 percent of lead, 9.8 percent of indium, and 0.2 percent of antimony (all percentages by weight) was used. The remainder of the conditions were the same as those of Example 1. The switching element thus obtained had a breakover voltage $V_0$ of approximately 12 volts.

*Example 3*

For the impurity alloy 26 indicated in FIG. 14, an alloy containing 85 percent of lead, 14.9 percent of indium, and 0.1 percent of arsenic (all percentages by weight) was used. The remainder of the conditions were the same as those of Example 1. The switching element thus obtained had a breakover voltage of 2 volts.

Furthermore, by providing a third electrode 10 in the base body semiconductor 22 of each of the aforesaid switching elements and impressing a control voltage $V_a$ thereon, it was possible to vary the breakover voltage $V_0$ at will within a certain range.

In the above description and examples, n-type germanium is principally used as the base body semiconductor, and antimony, arsenic, and indium are used as the active impurity. However, germanium of intrinsic type (i-type) or p-type conductivity of low impurity concentration (p-type) may also be used for the base body germanium. Furthermore, it is similarly possible to utilize combinations of a semiconductor other than germanium with a suitable impurity. Still furthermore, it is possible to use also as the impurity alloy, in addition to the above-described donor and acceptor impurities, mixtures therewith of such so-called carrier metals as tin and lead which will not noticeably impair the characteristics of the semiconductor. Moreover, each of the donor and acceptor impurities is not necessarily limited to one kind;

each of the said impurities may be of one kind or a mixture of two or more kinds.

Possibilities of further modifications are afforded by the fact that, in order to form the first semiconductor domain 21 indicated in FIG. 14, the method used is not necessarily limited to the alloy method, the conventionally known, impurity diffusion method, the bonding method, or another such method being useable. It is a further advantage of the invention that, by removing the portions indicated by the dotted lines in FIG. 10 or FIG. 14 of the switching element obtained by the process of this invention, by such a method as a chemical or an electro-chemical method, it is possible to make the junctions between the second, third, and fourth semiconductor domains completely independent.

Figure 15:
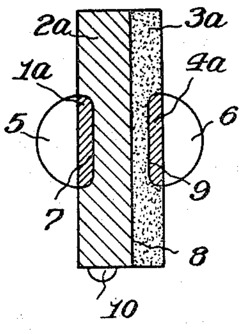
FIG. 15 is a structural diagram, in section, showing one embodiment of the switching element of the invention.

Another embodiment of the process for producing the switching element of the present invention as described above will now be considered. As indicated in FIG. 15, indium is caused to infiltrate by the diffusion method into one surface of a thin wafer of germanium 2 (thickness, approximately 0.1 mm.) of n-type and of low impurity concentration to create a p-type transition layer 3*a*, and its surface impurity concentration is caused to be approximately $10^{18}$ cm.$^{-3}$. In the center of the other surface of the said thin piece of germanium 2, a dot material 5 composed of an alloy of approximately 85 percent of lead and approximately 15 percent of indium is placed, and in the center of the surface of the p-type transition layer 3*a*, a dot material 6 of a lead alloy containing 0.5 to 5 percent antimony is placed; then, under this condition, the said dots are caused to be bonded by welding at from 700° C. to 750° C.

In this case the recrystallized layer 1*a* created in the center of the surface of the n-type germanium becomes one of p-type, and the recrystallized layer 4*a* created in the center of the surface of the p-type transition layer 3*a* becomes an n-type semiconductor of relatively low impurity concentration. Accordingly, it is thus possible to construct a psp$^+$n$^-$ switching element. By further providing the s domain 2*a* or the p$^+$ domain 3*a* with a third electrode 10, the element can be operated as a three-electrode switching element.

While, in the foregoing disclosure of the present invention and embodiments thereof, pspn switching elements wherein germanium is used have been described, the true spirit and scope of the invention is not to be limited to the use of germanium, since silicon or another semiconductor may be similarly used. It will be further appreciated that switching elements, of this type, of nsnp structure may be similarly embodied by the present invention.

Since it is obvious that still further changes and modifications can be made in the above-described details without departing from the nature and spirit of the invention, it is to be understood that the invention is not to be limited to the details described herein except as set forth in the appended claims.

What we claim:

1. A semiconductor switching element comprising a plurality of successively connected semiconductor domains comprising a first domain of a first conductivity type, a second domain ("S") having a resistivity approximating that of the intrinsic semiconductor and of conductivity type selected from the group consisting of said first conductivity type, the intrinsic conductivity type, and a second conductivity type, a third domain of said first conductivity type, and a fourth domain of said second conductivity type, to produce a pspn or an nsnp element; the effective concentration of the active impurity of the fourth domain being lower than the active impurity concentration of the third domain, to yield a current amplification factor from the fourth domain to the second domain which is small in the low-current operating region, but which increases with increasing current; the sum of said current amplification factor and the effective current amplification factor from the first domain to the third domain being less than unity in the low-current operating region, and rising to unity or greater as the operating current increases.

2. A semiconductor switching element in accordance with claim 1, in which said second domain has a width which is less than the diffusion length of the minority carriers injected from either the first domain or the third domain.

3. A process for producing a semiconductor switching element which comprises: forming a first semiconductor domain of a first conductivity type on one surface of a base body semiconductor whose conductivity type is selected from the group consisting of said first conductivity type, the intrinsic conductivity type, and a second conductivity type; said base body semiconductor having a lower active impurity concentration than that of said first semiconductor domain; melting against another surface of said base body semiconductor an alloy containing a first active impurity which has a fluctuating effective segregation coefficient in the recrystallization growth rate of the base body semiconductor, and which first impurity imparts the second conductivity type with respect to the base body semiconductor; said alloy also containing a second active impurity which has a smaller fluctuation of effective segregation coefficient than said first active impurity, and which second impurity imparts the first conductivity type with respect to said base body semiconductor; thereafter cooling the resulting molten alloy at such a rate, relative to the respective proportions of said active impurities and their segregation-coefficient fluctuation rates, as to produce recrystallization of the semiconductor domain of the first conductivity type and of high impurity concentration next to the said base body semiconductor, followed by recrystallization of the semiconductor domain of the second conductivity type and of lower effective impurity concentration.

4. The process in accordance with claim 3, in which said alloy also includes a neutral carrier metal for said active impurities.

References Cited by the Examiner

UNITED STATES PATENTS

| | | | |
|---|---|---|---|
| 2,821,493 | 1/58 | Carman | 148—1.5 |
| 2,836,521 | 5/58 | Longini | 148—1.5 |
| 2,862,840 | 12/58 | Kordalewski | 148—1.5 |
| 2,981,849 | 4/61 | Gobat | 148—1.5 X |
| 2,981,874 | 4/61 | Rutz | 148—1.5 X |
| 3,001,894 | 9/61 | Becker et al. | 148—177 |
| 3,049,451 | 8/62 | Carlat et al. | 148—185 |

BENJAMIN HENKIN, *Primary Examiner.*

MARCUS U. LYONS, HYLAND BIZOT, *Examiners.*